United States Patent
Rais-Zadeh et al.

(10) Patent No.: US 9,917,244 B2
(45) Date of Patent: Mar. 13, 2018

(54) RESONANT BODY HIGH ELECTRON MOBILITY TRANSISTOR

(71) Applicant: The Regents of The University of Michigan, Ann Arbor, MI (US)

(72) Inventors: Mina Rais-Zadeh, Ann Arbor, MI (US); Azadeh Ansari, Ann Arbor, MI (US)

(73) Assignee: The Regents of The University of Michigan, Ann Arbor, MI (US)

(*) Notice: Subject to any disclaimer, the term of this patent is extended or adjusted under 35 U.S.C. 154(b) by 26 days.

(21) Appl. No.: 14/741,764

(22) Filed: Jun. 17, 2015

(65) Prior Publication Data

US 2015/0364669 A1    Dec. 17, 2015

Related U.S. Application Data

(60) Provisional application No. 62/013,182, filed on Jun. 17, 2014.

(51) Int. Cl.
| | |
|---|---|
| *H01L 41/107* | (2006.01) |
| *H01L 41/18* | (2006.01) |
| *H03H 3/007* | (2006.01) |
| *H03H 9/02* | (2006.01) |
| *H03H 9/24* | (2006.01) |
| *H01L 27/20* | (2006.01) |

(52) U.S. Cl.
CPC .......... *H01L 41/107* (2013.01); *H01L 27/20* (2013.01); *H01L 41/18* (2013.01); *H03H 3/0072* (2013.01); *H03H 9/02259* (2013.01); *H03H 9/2426* (2013.01); *H03H 2009/02314* (2013.01); *H03H 2009/241* (2013.01)

(58) Field of Classification Search
None
See application file for complete search history.

(56) References Cited

U.S. PATENT DOCUMENTS

| 7,514,759 B1 | 4/2009 | Mehta et al. |
| 2006/0017064 A1 | 1/2006 | Saxler et al. |

(Continued)

FOREIGN PATENT DOCUMENTS

| JP | 2013098317 A | 5/2013 |
| KR | 20030075749 A | 9/2003 |

OTHER PUBLICATIONS

A. Ansari, et al "Monolithic Integration of GaN-Based Micromechanical Resonators and HEMT's for Timing Applications", IEEE (IEDM) 2012.

*Primary Examiner* — Fernando L Toledo
*Assistant Examiner* — Lawrence-Linh T Nguyen
(74) *Attorney, Agent, or Firm* — Harness, Dickey & Pierce, P.L.C.

(57) ABSTRACT

A resonant body high electron mobility transistor is described with resonance frequencies in gigahertz regime, limited by the cutoff frequency of the readout transistor. Piezoelectric materials form the resonating membrane of the device. Different modes of acoustic resonance, such as a thickness-mode, can be excited and amplified by applying an AC signal to the transducer electrode and proper biasing of all electrodes. The drain electrode reads out the acoustic resonance and amplifies it. The drain electrode is placed at or near where the piezoelectric charge pickup is maximum; whereas, the source electrode is placed at a nodal point with minimum displacement.

20 Claims, 8 Drawing Sheets

(56) References Cited

U.S. PATENT DOCUMENTS

| | | | |
|---|---|---|---|
| 2010/0155780 A1* | 6/2010 | Machida | H01L 29/1066 257/192 |
| 2010/0188069 A1* | 7/2010 | Ren | G01N 27/4145 324/71.5 |
| 2010/0301347 A1* | 12/2010 | Chung | H01L 21/2007 257/76 |
| 2013/0009165 A1 | 1/2013 | Park et al. | |
| 2013/0056751 A1 | 3/2013 | Ziaei et al. | |
| 2013/0240953 A1* | 9/2013 | Imada | H01L 29/778 257/194 |
| 2013/0344819 A1 | 12/2013 | Ozgur et al. | |

* cited by examiner

RESONANT BODY HIGH ELECTRON MOBILITY TRANSISTOR

CROSS-REFERENCE TO RELATED APPLICATIONS

This application claims the benefit of U.S. Provisional Application No. 62/013,182, filed on Jun. 17, 2014. The entire disclosure of the above application is incorporated herein by reference.

GOVERNMENT CLAUSE

This invention was made with government support under ECCS1002036 awarded by the National Science Foundation. The Government has certain rights in the invention.

FIELD

The present disclosure relates to a resonant body high electron mobility transistor.

BACKGROUND

Gallium Nitride (GaN) is proven to be the material of choice for high-frequency, high-power, and high-temperature applications owing to its wide bandgap and large breakdown electric field. GaN also offers a number of excellent mechanical properties such as strong piezoelectric and pyroelectric effects, high acoustic velocity, and superb mechanical and chemical stability, making it a suitable material for nano/microelectromechanical systems (NEMS/MEMS). High-performance GaN micromechanical resonators operating in gigahertz regime are required for a number of applications. Extending the frequency of GaN resonators deep into the gigahertz regime, where GaN ICs usually operate at, is hindered because of a large capacitive feedthrough between the input/output electrodes. In this disclosure, a resonant-body high electron mobility transistor (RB-HEMT) operating in thickness mode is introduced.

The concept of resonant body or resonant gate transistors (RBT's or RGT's) dates back to the introduction of the MEMS resonators. In the past few years, research on RBT's was revived mostly using silicon (Si) as the resonating material. One major difference between GaN RB-HEMTs and Si-based RBTs is the origin and the properties of the transistor conduction channel. Spontaneous and piezoelectric polarization creates a fixed positive charge at the AlGaN/GaN interface. The positive sheet charge confines electrons at the AlGaN/GaN interface in a potential well, forming a 2-D electron gas (2-DEG) channel present at a zero gate voltage (i.e., the transistor is normally ON). The origin of the conduction channel in the III-nitride HEMT structures suggests that these transistors are very sensitive to mechanical stress, which changes the piezoelectric polarization-induced surface and interface charges. In Si-based transistors, however, the conduction channel is based on creating an inversion layer in the doped substrate by applying a gate voltage, which results in a higher scattering due to the presence of parent atoms in the channel, higher 1/f noise, lower channel carrier mobility, and more pronounced electron scattering because of imperfections and surface roughness at the noncrystalline silicon/silicon dioxide interface. Above all, unlike Si-based field effect transistors, GaN HEMTs make it possible to take advantage of piezoelectric actuation inherent in GaN material systems.

An AlGaN/GaN resonant body HEMT was first demonstrated in M. Faucher, et al's "Amplified Piezoelectric Transduction of Nanoscale Motion In Gallium Nitride Electromechanical Resonators", Appl. Phy. Lett., Vol. 94, No. 23, page 233506, June 2009, and was used to excite the flexural-mode resonance of a beam with frequencies in low megahertz range. In this disclosure, a single resonating HEMT is described that not only is the main vibrating element, but also is used to transduce the thickness-mode acoustic resonance.

This section provides background information related to the present disclosure which is not necessarily prior art.

SUMMARY

This section provides a general summary of the disclosure, and is not a comprehensive disclosure of its full scope or all of its features.

A high electron mobility resonant body transistor device is provided. The resonant body transistor is comprised of an electromechanical transducer and a transistor disposed on a resonating membrane. The resonating membrane is defined by a first piezoelectric layer and a piezoelectric transduction layer. The first piezoelectric layer is first disposed onto the surface of the substrate. The piezoelectric transduction layer is disposed onto the surface of the first piezoelectric layer, thereby forming a two dimensional electron gas sheet at the interface between the first piezoelectric layer and the piezoelectric transduction layer. A source electrode, a top gate electrode, and a drain electrode are each disposed on the piezoelectric transduction layer and collectively form the transistor. The electromechanical transducer is comprised of a back gate electrode and, in response to an applied AC input signal, is configured to induce strain on the resonating membrane to actuate a thickness resonance mode.

In some embodiments, the substrate is without a cavity. In other embodiments, the substrate has a cavity therein which is enclosed by the resonating membrane.

In an example embodiment, the electromechanical transducer is a piezoelectric transducer. One or more back gate electrodes are disposed on the resonating membrane and form Schottky contact with the piezoelectric transduction layer. The back gate electrode(s) are preferably biased at a depletion region and disposed at a location where the induced strain has a maximum value.

The drain electrode is disposed on the resonating membrane and forms ohmic contact with the piezoelectric transduction layer. The source electrode is disposed on the resonating membrane and forms an ohmic contact with the piezoelectric transduction layer. The top gate electrode is disposed between the source electrode and the drain electrode on the resonating membrane and forms a Schottky contact with the piezoelectric transduction layer. The top gate electrode can be biased to a depletion region and disposed adjacent to the second location wherein the induced strain has a maximum value.

In some embodiments, the drain electrode can be disposed at or near a second location wherein the induced strain has a maximum value. In other embodiments, the gate electrode and the drain electrode are arranged such that the second location is in between the gate electrode and the drain electrode (and preferably closer to the gate electrode).

In response to the applied AC input signal, the drain-source current is modulated and shows resonance peaks at harmonics of the AC input signal frequency. The applied AC input signal overlaps with thickness-mode resonance harmonic frequencies of the resonating membrane.

In some embodiments, the piezoelectric transducer can be implemented by a pair of interdigitated transducers disposed on opposing side of the transistor.

In other embodiments, the drain is located at one end of the membrane and the piezoelectric transducer at the other end of the membrane with the source placed at the resonance nodal point between the piezoelectric transducer and the drain.

In some embodiments, the high electron mobility transistor has multiple interdigitated fingers. For example, the gate has two fingers placed between two sources on the side and a single drain electrode in the middle.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1A:
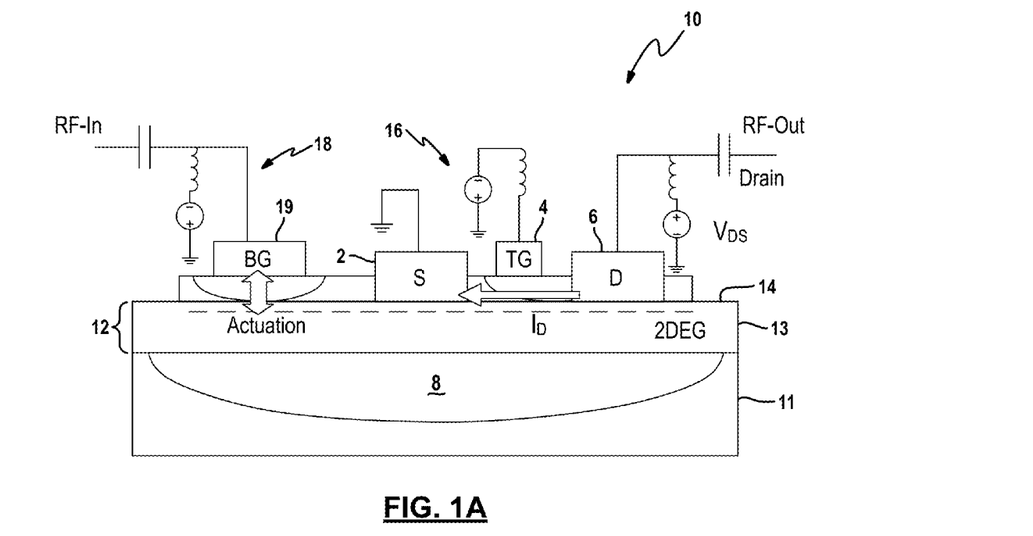
FIG. 1A is a diagram of an example embodiment of a resonant body transistor with integrated piezoelectric transducer.
Figure 1B:
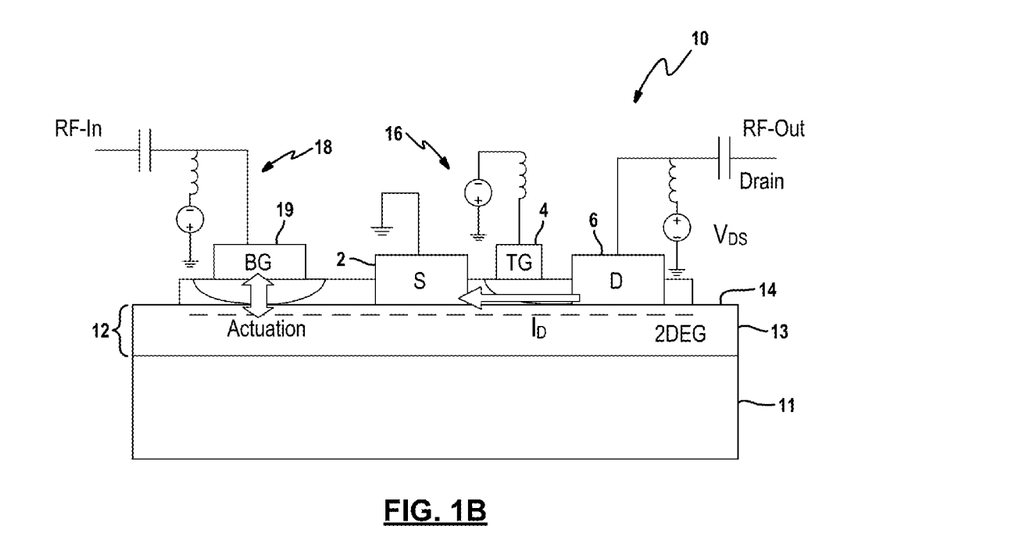
FIG. 1B is a diagram of an alternative embodiment of a resonant body transistor with integrated piezoelectric transducer.

FIG. 1 depicts an example embodiment of a high electron mobility resonant body transistor 10. The resonant body transistor 10 is comprised generally of a resonating membrane 12, a transistor 16 and an electromechanical transducer 18. Unlike previous devices, where flexural resonance modes are excited by a HEMT actuator placed at one end of a suspended beam and read out through a separate HEMT at the other end, the proposed device is more compact, has higher electromechanical coupling efficiency, and operates at higher frequencies.

The resonating membrane 12 is disposed on a surface of substrate 11. The resonating membrane 12 is comprised of a first piezoelectric layer 13 and a piezoelectric transduction layer 14. The first piezoelectric layer 13 is first disposed onto the surface of the substrate 11. In one embodiment, the substrate 11 has a cavity 8 defined therein and the resonating membrane 12 encloses the cavity 8 as shown in FIG. 1A. In other embodiments, the resonating membrane 12 may be formed on top of a substrate without a cavity as shown in FIG. 1B. In either case, the piezoelectric transduction layer 14 is disposed onto the surface of the first piezoelectric layer 13, thereby forming a two dimensional electron gas sheet at the interface between the first piezoelectric layer 13 and the piezoelectric transduction layer 14.

In the example embodiment, the electromechanical transducer 18 is a piezoelectric transducer 18 formed on one side of the resonating membrane 12; whereas, the transistor 16 is formed on an opposite side of the resonating membrane 12. More specifically, the piezoelectric transducer 18 is comprised of a back gate (BG) electrode 19 formed on the top exposed surface of the piezoelectric transduction layer 14. The back gate electrode forms a Schottky contact with the piezoelectric transduction layer 14. In response to an AC input signal applied thereto, the back gate electrode induces strain on the resonating membrane 12 to actuate in a thickness resonance mode. The back gate electrode 19 is preferably disposed on the piezoelectric transduction layer 14 at or near a location where the induced strain has a maximum value.

In the example embodiment, the transistor 16 includes a source electrode 2, a top gate electrode 4, and a drain electrode 6. More specifically, the drain electrode 6 is disposed on an opposing side of the resonating membrane 12 in relation to the back gate electrode 19 and forms an ohmic contact with the piezoelectric transduction layer 14. The source electrode 2 is disposed between the back gate electrode 19 and the drain electrode 6 and forms an ohmic contact with the piezoelectric transduction layer 14. The top gate electrode 4 is disposed between the source electrode 2 and the drain electrode 6 on the piezoelectric transduction layer 14 and forms a Schottky contact with the piezoelectric transduction layer 14.

In some embodiments, the drain electrode may be disposed at or near a second location where the induced strain has a maximum value. In these embodiments, the top gate electrode is disposed adjacent to the drain electrode and may overlap with the second location where the induced strain has a maximum value. In other embodiments, the gate electrode and the drain electrode are arranged such that the second location where the induced strain has a maximum value is in between the gate electrode and the drain electrode (and preferably closer to the gate electrode). In other words, the top gate electrode and the drain electrode are arranges such that the 2-DEG channel between them is places at or near the location where the induced strain has a maximum value.

The resonant body transistor 10 can potentially be used in oscillators and frequency-shifting sensors to realize single-chip GaN-based integrated sensors and systems. The resonance frequency is set by the thickness of the stack and can be trimmed using mass loading or material removal as in the case of conventional film bulk acoustic resonators (FBARs). Their fabrication requires no modification to the HEMT baseline fabrication process with the exception of a single release step added as the final stage. These devices require no backside metallization and can be potentially solidly mounted on the substrate using proper acoustic wave reflectors placed underneath the main resonating body, eliminating the mechanical releasing step, as shown in FIG. 1B.

Figure 3A:
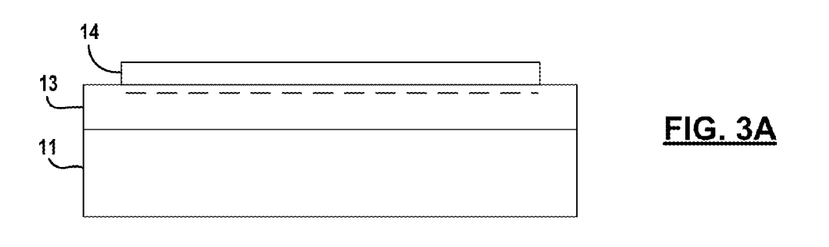
FIGS. 3A-3D are diagrams depicting an example fabrication method for the resonant body transistor.

With reference to FIGS. 3A-3D, the resonant body transistor 10 can be fabricated using a metal-organic chemical vapor deposition (MOCVD) process. In an example embodiment, silicon serves as the starting wafer 11. In this way, one can take advantage of the mature silicon technology although other materials for the substrate are contemplated by this disclosure. The first piezoelectric layer 13 is first disposed onto the surface of the substrate 11. The piezoelectric transduction layer 14 is then disposed onto the surface of the first piezoelectric layer 13, thereby forming a two dimensional electron gas sheet (signified by the dotted line) at the interface between the first piezoelectric layer 13 and the piezoelectric transduction layer 14. In the example embodiment, the first piezoelectric layer 13 is comprised of gallium nitride (GaN) having a thickness on the order of 1.8 µm and the piezoelectric transduction layer 14 is comprised of aluminum gallium nitride (AlGaN) having a thickness on the order of 175 Å. Gallium arsenide and aluminum gallium arsenide as well as other types of III-V semiconductors of varying thicknesses may also be used for these layers. An active area of the resonant body transistor is defined by removing the 2-DEG outside of the mesa islands as seen in FIG. 3A.

Figure 3B:
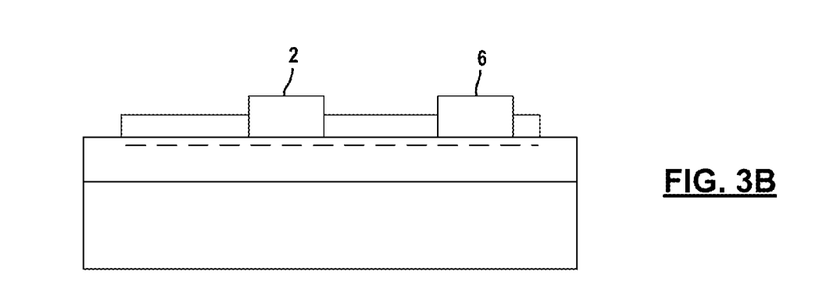

Next, the source electrode 2 and the drain electrode 6 are formed on the piezoelectric transduction layer 14 as seen in FIG. 3B. The ohmic contacts may be comprised of titanium aluminum, titanium gold or other suitable alloys. These electrodes may optionally be annealed in nitrogen environment, for example for 30 seconds at 850° C.

Figure 3C:
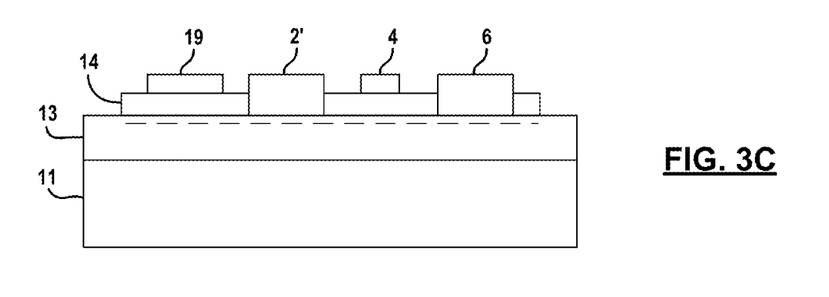
Figure 3D:
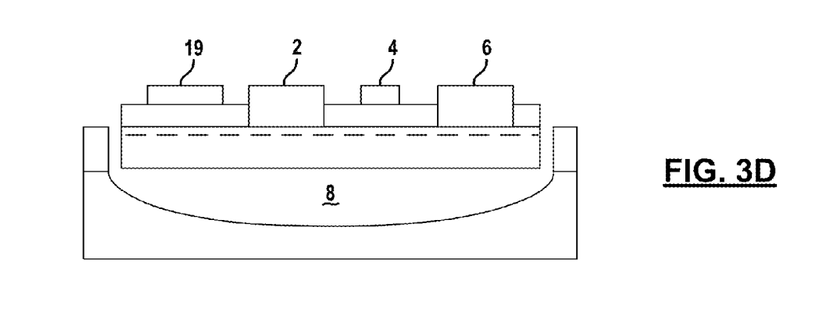

In FIG. 3C, the top gate electrode 4 and the back gate electrode 19 are deposited for the purpose of electrical modulation of the 2-DEG and acoustic actuation, respectively. These Schottky contacts may be comprised of nickel gold although other alloys are contemplated by this disclosure. Lastly, vias were made through the gallium nitride layer to access the substrate 11, which is then isotropically etched by xenon difluoride ($XeF_2$) to form a cavity therein. While a particular fabrication technique has been described, it is understood that other techniques for constructing the resonant body transistor fall within the broader aspects of this disclosure.

Figure 2A:
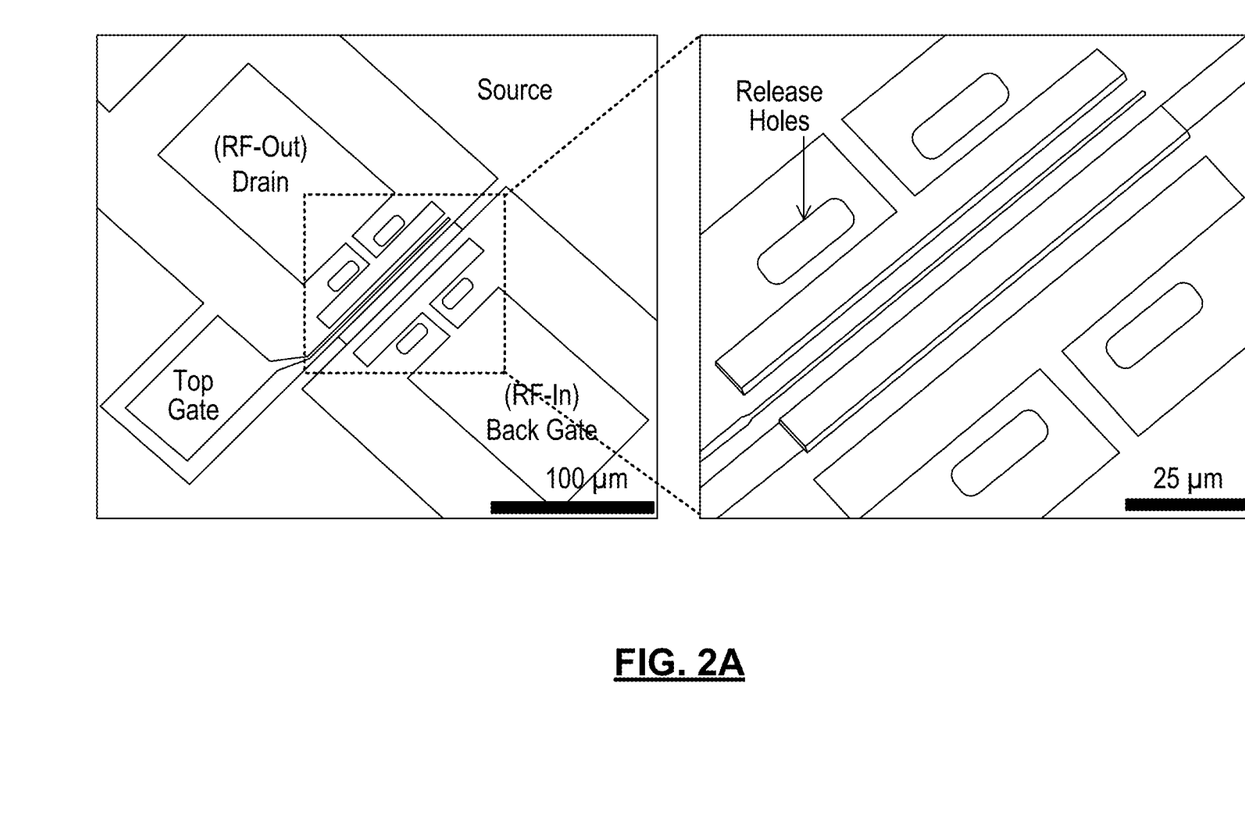
FIG. 2A is a top view of the resonant body transistor
Figure 2B:
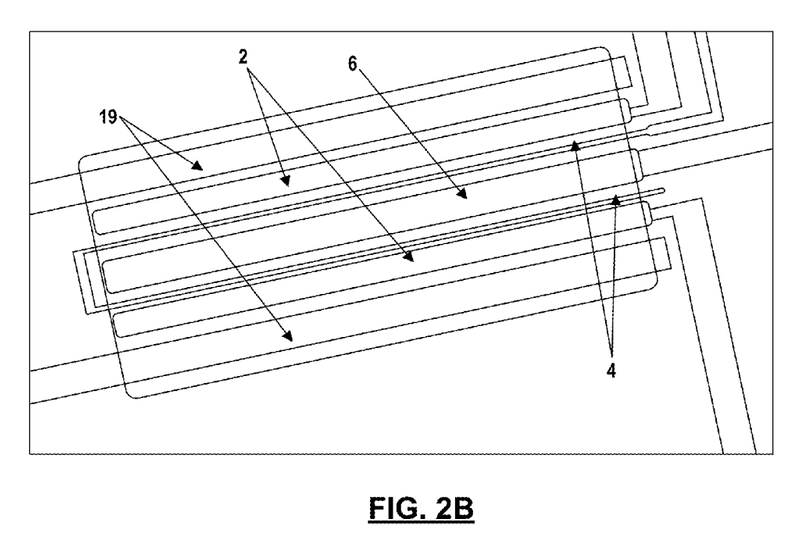
FIG. 2B is a top view of a resonant body transistor with interdigitated fingers.
Figure 2C:
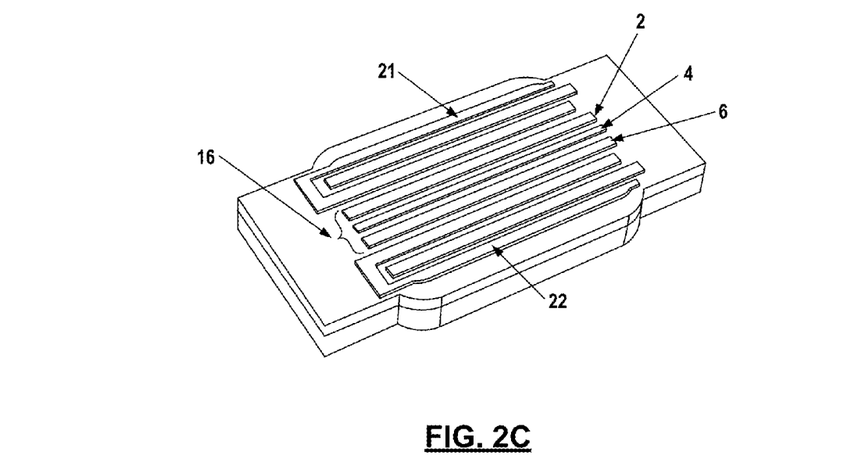
FIG. 2C is a top view of a resonant body transistor with an alternative arrangement of interdigitated fingers.

Referring to FIGS. 2A and 2B, the thickness-mode resonance of the resonant body transistor 10 is effectively transduced using a piezoelectric transducer with a single electrode as shown in FIG. 2A or with interdigitated electrodes as shown in FIGS. 2B and 2C. Given the stack mentioned earlier and using the electrode layout shown in FIG. 2A, the fundamental thickness mode resonance at 2.12 GHz is excited showing a mechanical Q of 105. The second-order thickness-mode resonance at 4.23 GHz shows a Q of 250.

In FIG. 2B, an alternative arrangement for the high electron mobility transistor has multiple interdigitated fingers. For example, the top gate 4 has two fingers placed between two source electrodes 2 on the side with a single drain electrode 6 in the middle. In another arrangement, the piezoelectric transducer is implemented by a pair of interdigitated transducers 21, 22 disposed on opposing sides of the transistor 16 as shown in FIG. 2C. By optimizing the location of the fingers, different resonance modes or harmonics can be excited in the resonant body high electron mobility transistor. Other arrangements for the electrodes forming the piezoelectric transducer are also contemplated by this disclosure.

Figure 4:
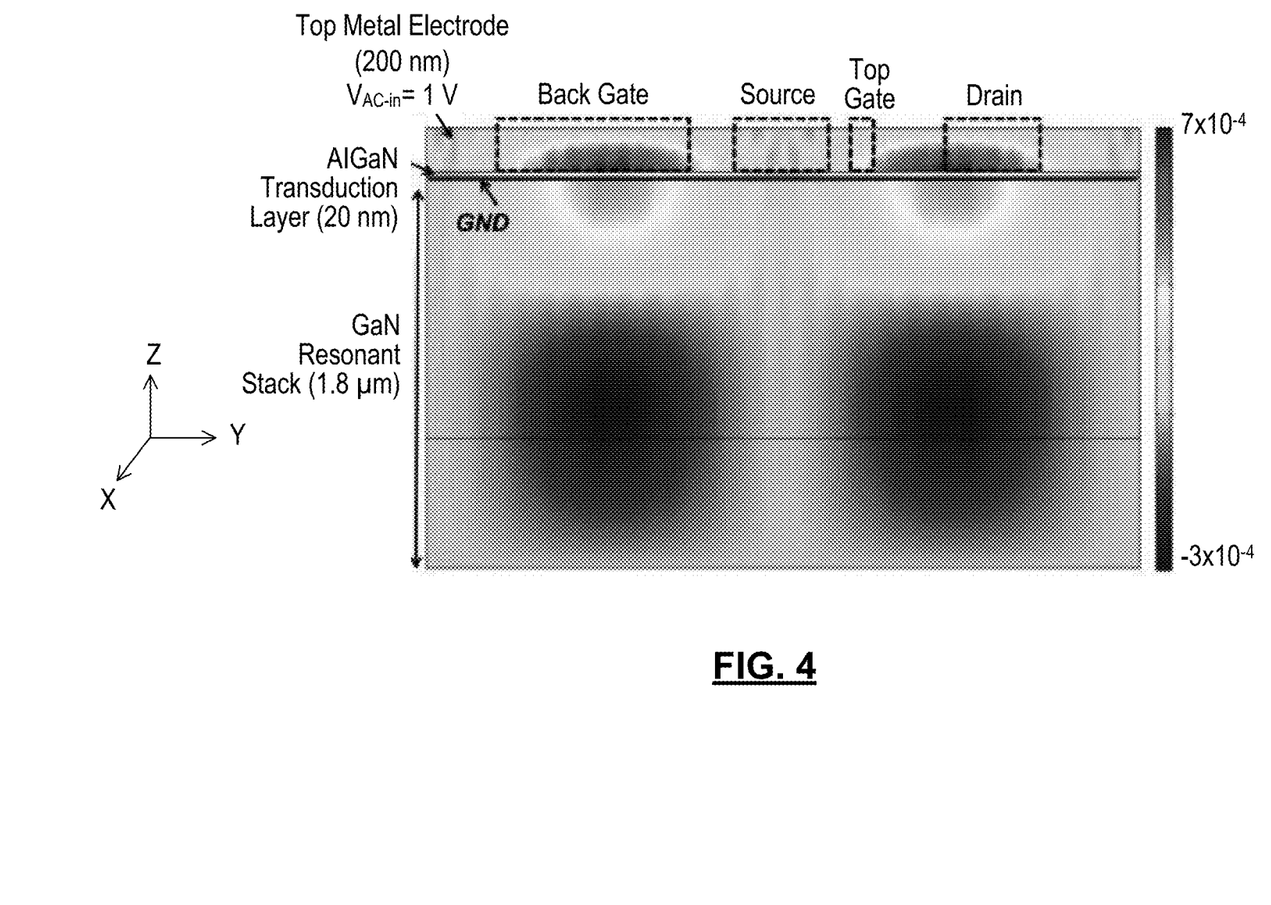
FIG. 4 is an image of a two-dimensional simulation of strain in the thickness direction showing the second-order thickness-mode resonance of the resonant body transistor.

In operation, the resonant body transistor 10 is a four-terminal device with a piezoelectric transducer consisting of a back gate Schottky contact to launch the acoustic wave into the device, a drain ohmic contact to sense the acoustic resonance, a source ohmic contact tied to zero potential to access the 2-DEG channel, placed at a nodal point, and an additional Schottky contact used for electrical modulation of the conducting channel (top gate). For the example embodiment shown in FIG. 2A, the simulated strain along the thickness of the device (z-direction) is obtained using COMSOL multiphysics simulation tool as shown in FIG. 4. An actuation voltage with amplitude of 1 volt is applied to the top actuation electrode in the simulation defining the location of the back gate actuation contact. The source ohmic contact is utilized to access the 2-DEG channel (bottom electrode), and thus is placed in the middle of the structure with a minimum displacement. The modulated signal is the drain current, picked up from the drain contact. A maximum strain is also induced at near the drain and gate contacts such that the change the 2-DEG sheet density is in turn reflected as a change in the drain current. Accordingly, the drain electrode overlaps with this second location wherein the induced stain has a maximum value and the top gate electrode is disposed adjacent to this second location as seen in FIG. 4.

In the example embodiment, the thin depleted AlGaN layer sandwiched between the back gate Schottky contact and the 2-DEG experiences a very high vertical electric field and is responsible for acoustic excitation of the entire 1.8 µm-thick AlGaN/GaN stack in the thickness direction, similar to piezoelectric actuation of standard metal-insulator-metal structures. The induced strain in the heterostructure is sensed through a change in the polarization at the AlGaN/GaN interface. The change in interfacial sheet density at the AlGaN/GaN interface is used to sense bulk acoustic waves at higher frequencies. Using transistor based sensing, the sensed signal does not depend on the pickup electrode area and thus the device dimensions can be further scaled down to realize higher resonance frequencies with higher sensitivities.

As proof of concept, the DC characteristics of the readout HEMT are measured using Keithly 4200-SCS parametric analyzer. RF measurements are carried out using an Agilent N5241A general-purpose network analyzer (PNA) with GSG ACP40 probes from Cascade Microtech in a Lakeshore TTPX probe station. Short-open-load-through (SOLT) calibration was performed prior to all measurements. All measurements were taken with 50Ω termination impedances.

As mentioned previously, the back gate Schottky contact is biased in the depletion region to avoid AlGaN layer degradation owing to current flow and to increase the piezoelectric transduction efficiency.

Figure 5A:
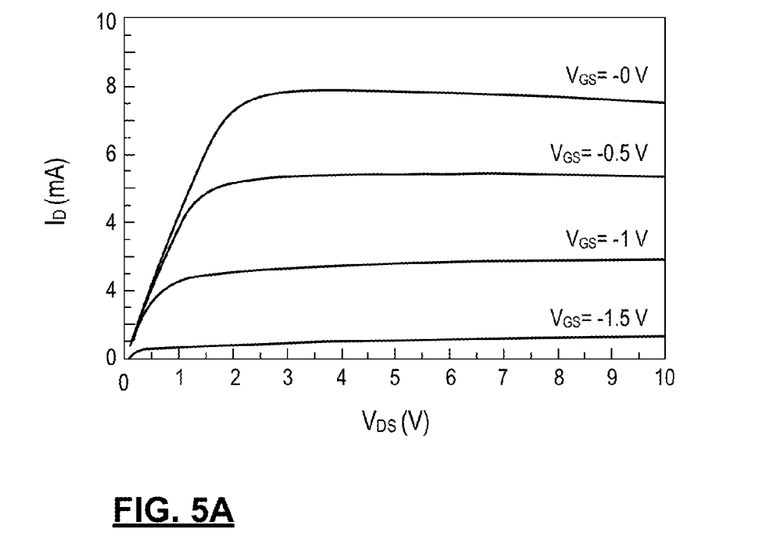
FIGS. 5A and 5B are graphs of DC I-V transfer curves plotted as drain current versus drain voltage at different gate voltage values, and drain current and transconductance versus top gate voltage, respectively.

DC response of the readout HEMT consists of the drain, top gate, source (with back gate floating). The gate width is 100 µm. FIG. 5A shows the DC I-V transfer curve plotted as drain current ($I_D$) versus drain voltage at different gate voltage ($V_{GS}$) values. The negative resistance at higher drain currents is associated with self-heating in the AlGaN/GaN HEMT channel. A threshold voltage of $V_{TH}=-1.9$ V is observed for the readout HEMT.

Figure 5B:
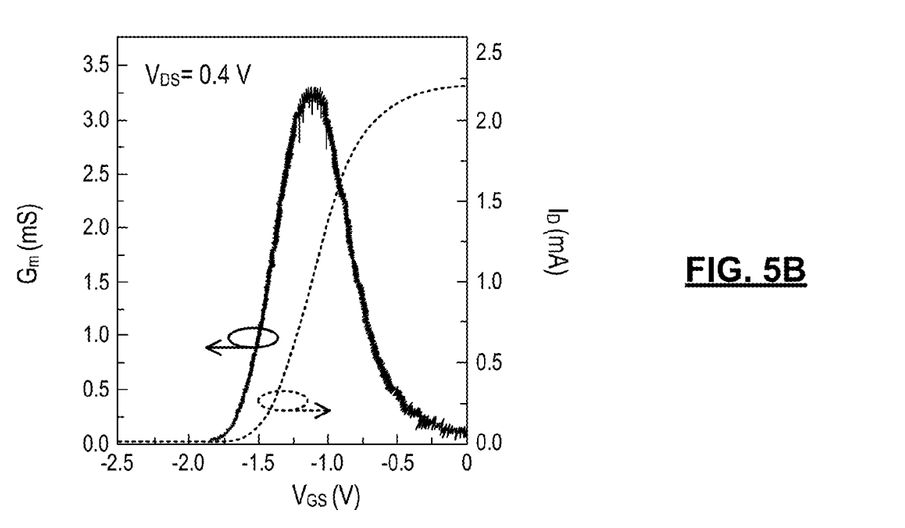
Figure 6A:
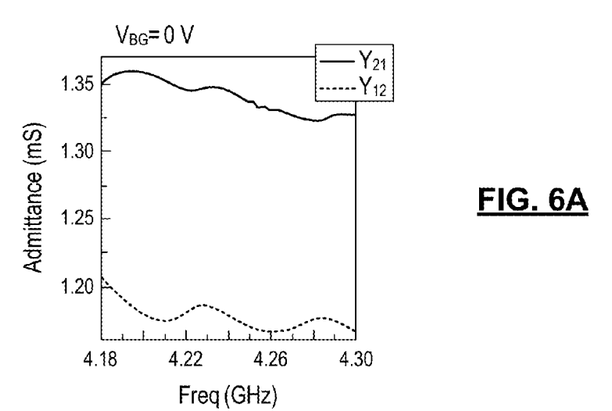
FIGS. 6A and 6B are graphs of the admittance parameters plotted when voltage applied to back gate ($V_{BG}$), the piezoelectric transducer, is $V_{BG}=0V$ and $V_{BG}=-1.8V$, respectively.
Figure 6B:
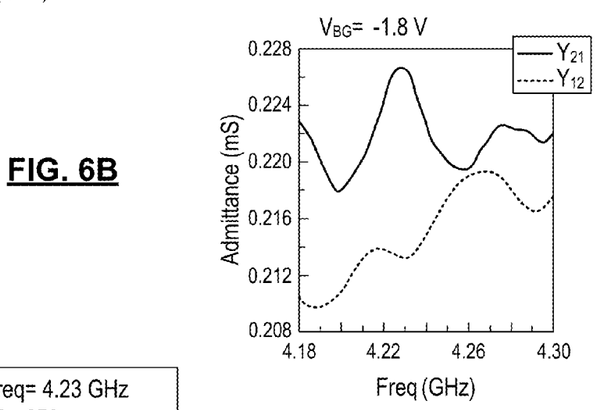

FIG. 5B shows the transconductance curve of the readout HEMT, measured from the top gate to the drain. The total transconductance of the resonant body HEMT is extracted using equation (1) below, similar to the case of conventional transistors with the back gate set as Port 1 and the drain at Port 2

$$|Y_{21}-Y_{12}|=\{\sqrt{\text{Real}(Y_{21}-Y_{12})\}^2+\{\text{Imag}(Y_{21}-Y_{12})\}^2}. \quad (1)$$

where $Y_{21}$ and $Y_{12}$ are two of the admittance parameters of the two port network. The total transconductance consists of a purely mechanical component ($g_a$) and an electrical broadband component ($g_{mb}$) related to the back gate electrical modulation. FIGS. 6A and 6B show $Y_{21}$, $Y_{12}$, and $g_a$ plots with an input actuation power of $P_{in}=-5$ dBm at two different back gate voltages: 1) $V_{BG}=0$ V and 2) $V_{BG}=-1.8$ V. The back gate-source junction is further depleted in case 2) compared with case 1), resulting in lower $Y_{21}$ and $Y_{12}$ feedthrough levels. Furthermore, the acoustic resonance peak only appears in case 2), proving that the back gate Schottky contact acts as the top electrode and the 2-DEG as the bottom electrode, with the most effective actuation occurring when the AlGaN layer is depleted and the conduction path is limited to the AlGaN/GaN interface. It is worth noting that large levels of feedthrough in the admittance plots are mainly due to the fact that the 2-DEG was kept uninterrupted within the resonating device and are mostly canceled out when the acoustic transconductance is extracted.

Figure 6C:
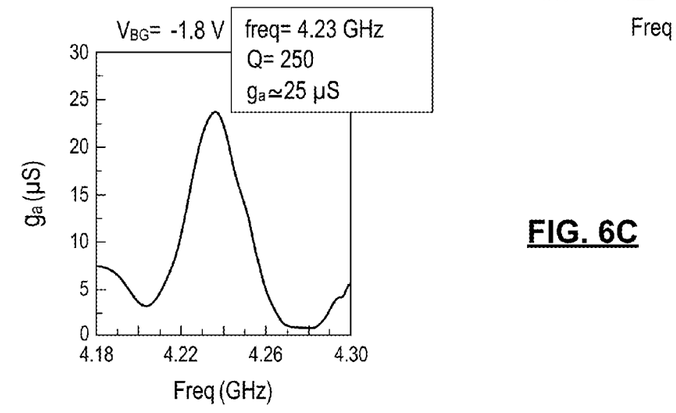
FIG. 6C is a graph plotting acoustic transconductance versus frequency for $V_{BG}=-1.8V$.

In FIG. 6C, $g_a$ is extracted by subtraction of the back gate electrical transconductance ($g_{mb}=0.043$ mS) from the total transconductance value ($|Y_{21}-Y_{12}|$). $g_a$ rises to ~25 µS with a very small off-resonance signal level. It must be noted that the acoustic transconductance of the resonant body transistor is measured from the back gate to the drain and does not follow the trend of the readout HEMT transconductance curve, measured from the top gate to the drain and shown in FIG. 5B.

Figure 7:
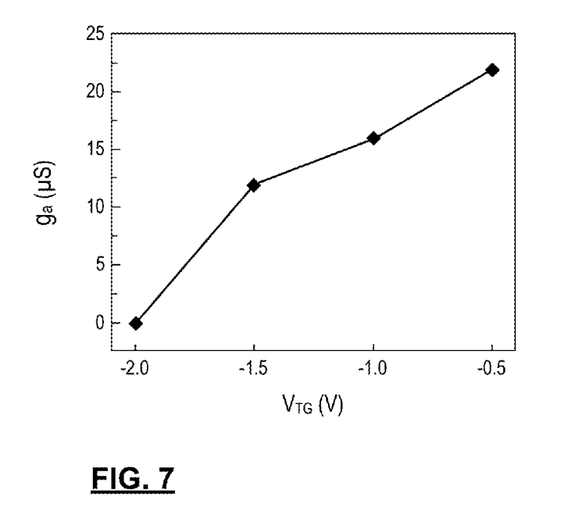
FIG. 7 is graph illustrating acoustic transconductance dependence on the top gate voltage ($V_{TG}$)

The depletion region between the top gate and the drain grows wider as the voltage difference between them increases, thus narrowing the conducting channel and lowering admittance values between the back gate and the drain. Hence, at a fixed drain voltage, as the top gate voltage becomes more negative, $g_a$ and $g_{mb}$ both drop. FIG. 7 depicts the acoustic transconductance versus the top gate DC voltage. The acoustic transconductance drops to zero when the channel is fully depleted.

Figure 8:
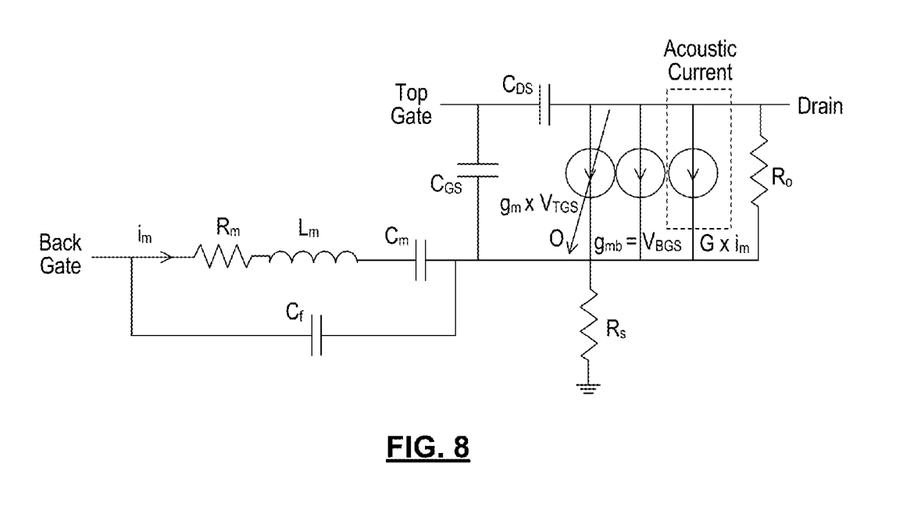
FIG. 8 is a schematic of an equivalent electrical circuit model of the resonant body transistor.

Equivalent circuit model of the device is shown in FIG. 8. The acoustic actuator is modeled with its Butterworth Van Dyke equivalent circuit. The motional branch ($R_m$, $L_m$, and $C_m$) is located between the back gate and source since the actuation is through the back gate Schottky electrode and the source ground electrode. The parallel capacitance ($C_f$) models the parasitic static capacitance of the actuator.

To model the acoustic current, a current-controlled current-source is used which senses the input motional current, $i_m$, and multiplies it by a unit-less factor of G. At the resonance frequency, G is equal to $R_m \times g_a$. $R_m$ is the motional resistance and $g_a$ is the acoustic transconductance from the back gate to the drain. The acoustic, $g_a$, back gate electrical, $g_{mb}$, and top gate electrical, $g_m$, transconductances are all dependent on the top gate DC voltage, as discussed earlier.

In summary, a resonant body high electron mobility transistor is described with resonance frequencies in gigahertz regime, limited by the cutoff frequency of the readout transistor. The proof-of-concept resonant body high electron mobility transistor operates in the linear transistor regime. Using an optimized design, the device can operate in the saturation region and take advantage of the intrinsic amplification of the HEMT. Such structures follow the same design procedure and are within the scope of this invention.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A high electron mobility resonant body transistor device, comprising:
    a substrate;
    a first piezoelectric layer disposed onto the surface of the substrate;
    a piezoelectric transduction layer disposed onto the surface of the first piezoelectric layer and forming a two dimensional electron gas sheet at the interface between the first piezoelectric layer and the piezoelectric transduction layer, where the first piezoelectric layer and the piezoelectric transduction layer define a resonating membrane;
    a source electrode, a top gate electrode, and a drain electrode collectively disposed directly on the piezoelectric transduction layer and collectively forming a transistor;
    a piezoelectric transducer comprised of a back gate electrode and, in response to an applied AC input signal, is configured to induce strain on the resonating membrane to actuate a thickness resonance mode, wherein the back gate electrode is disposed on the piezoelectric transduction layer at a location where the induced strain has a maximum value.

2. The resonant body transistor device of claim 1 wherein substrate having a cavity therein and the resonating membrane encloses the cavity.

3. The resonant body transistor device of claim 1 wherein the back gate electrode forms a Schottky contact with the piezoelectric transduction layer and is biased to a depletion region.

4. The resonant body transistor device of claim 1 wherein the drain electrode is disposed at an opposing side of the resonating membrane in relation to the back gate electrode and forms an ohmic contact with the piezoelectric transduction layer.

5. The resonant body transistor device of claim 1 wherein source electrode is disposed between the back gate electrode and the drain electrode on the resonating stack, and forms an ohmic contact with the piezoelectric transduction layer.

6. The resonant body transistor device of claim 1 wherein top gate electrode is disposed between the source electrode and the drain electrode on the resonating membrane and proximate to a second location wherein the induced strain has a maximum value.

7. The resonant body transistor device of claim 1 wherein top gate electrode forms a Schottky contact with the piezoelectric transduction layer.

8. The resonant body transistor device of claim 1 wherein drain-source current is modulated in response to the applied AC input signal, showing resonance peaks at harmonics of the AC input signal frequency.

9. The resonant body transistor device of claim 1 wherein the applied AC input signal overlaps with thickness-mode resonance harmonic frequencies of the resonating membrane.

10. The resonant body transistor device of claim 1 wherein the first piezoelectric layer is comprised of GaN and the piezoelectric transduction layer is comprised of AlGaN.

11. The resonant body transistor device of claim 1 wherein the piezoelectric transducer is implemented by a set of interdigitated transducers disposed on the resonating membrane.

12. The resonant body transistor device of claim 1 wherein the transistor is multi-finger implemented by a number of gate, drain, and/or source fingers.

13. A high electron mobility resonant body transistor device, comprising:
    a substrate;
    a first piezoelectric layer disposed onto the surface of the substrate;
    a piezoelectric transduction layer disposed onto the surface of the first piezoelectric layer and forming a two dimensional electron gas sheet at the interface between the first piezoelectric layer and the piezoelectric transduction layer, where the first piezoelectric layer and the piezoelectric transduction layer define a resonating membrane;
    a source electrode, a top gate electrode, a drain electrode collectively disposed directly on the piezoelectric transduction layer, wherein top gate electrode forms a Schottky contact with the piezoelectric transduction layer; and
    a piezoelectric transducer comprised of a back gate electrode and, in response to an applied AC input signal, is configured to induce strain on the resonating membrane to actuate a thickness resonance mode, wherein the back gate electrode forms a Schottky contact with the piezoelectric transduction layer and is biased to a depletion region.

14. The resonant body transistor device of claim 13 wherein substrate having a cavity therein and the resonating membrane encloses the cavity.

15. The resonant body transistor device of claim 13 wherein the back gate electrode is disposed proximate to a location where the induced strain has a maximum value.

16. The resonant body transistor device of claim 13 wherein the drain and source electrodes form ohmic contacts with the piezoelectric transduction layer.

17. The resonant body transistor device of claim 13 wherein the top gate electrode and the drain electrode are disposed on the resonating membrane such that a second location wherein the induced strain has a maximum value is in between the top gate electrode and the drain electrode.

18. The resonant body transistor device of claim 13 wherein drain-source current is modulated in response to the applied AC input signal, showing resonance peaks at harmonics of the AC input signal frequency.

19. The resonant body transistor device of claim 18 wherein the applied AC input signal overlaps with thickness-mode resonance harmonic frequencies of the resonating membrane.

20. The resonant body transistor device of claim 13 wherein the first piezoelectric layer is comprised of GaN and the piezoelectric transduction layer is comprised of AlGaN.

* * * * *

UNITED STATES PATENT AND TRADEMARK OFFICE
CERTIFICATE OF CORRECTION

PATENT NO. : 9,917,244 B2
APPLICATION NO. : 14/741764
DATED : March 13, 2018
INVENTOR(S) : Mina Rais-Zadeh et al.

Page 1 of 1

It is certified that error appears in the above-identified patent and that said Letters Patent is hereby corrected as shown below:

In the Specification

At Column 1, Line number 14-16, "This invention was made with government support under ECCS1002036 awarded by the National Science Foundation. The Government has certain rights in the invention." should be --This invention was made with government support under ECCS1002036 awarded by the National Science Foundation and N00014-14-1-0680 awarded by the Office of Naval Research. The government has certain rights in the invention.--

Signed and Sealed this
Seventeenth Day of March, 2020

Andrei Iancu
*Director of the United States Patent and Trademark Office*